(12) United States Patent
Ito et al.

(10) Patent No.: US 9,967,113 B2
(45) Date of Patent: May 8, 2018

(54) RECEPTION APPARATUS PERFORMING TURBO EQUALIZATIONS

(71) Applicant: Hitachi Kokusai Electric Inc., Tokyo (JP)

(72) Inventors: Kei Ito, Tokyo (JP); Keisuke Yamamoto, Tokyo (JP); Tatsuhiro Nakada, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 55 days.

(21) Appl. No.: 15/266,328

(22) Filed: Sep. 15, 2016

(65) Prior Publication Data

US 2017/0005840 A1    Jan. 5, 2017

Related U.S. Application Data

(63) Continuation of application No. PCT/JP2015/056499, filed on Mar. 5, 2015.

(30) Foreign Application Priority Data

Mar. 31, 2014   (JP) ................................ 2014-071044

(51) Int. Cl.
*H03M 13/00* (2006.01)
*H04L 25/03* (2006.01)
(Continued)

(52) U.S. Cl.
CPC .... *H04L 25/03318* (2013.01); *H03M 13/258* (2013.01); *H03M 13/2948* (2013.01);
(Continued)

(58) Field of Classification Search
CPC ......... H03M 13/2957; H03M 13/2948; H03M 13/3746; H03M 13/2951; H03M 13/6331;
(Continued)

(56) References Cited

U.S. PATENT DOCUMENTS 6,813,219 B1    11/2004  Blackmon
2003/0095593 A1*  5/2003  Tripathi ............ H04L 25/03171
                                                                    375/233
(Continued)

FOREIGN PATENT DOCUMENTS

JP      2002-190744 A    7/2002
JP      2009-188640 A    8/2009
JP      2012-213135 A    11/2012

OTHER PUBLICATIONS

Y. Gong et al., MMSE Turbo Equalizer for Channels With Cochannel Interference, 2006, Institute of Electronics, Communications and Information Technology.
(Continued)

*Primary Examiner* — Christine T. Tu
(74) *Attorney, Agent, or Firm* — Bacon & Thomas, PLLC

(57) ABSTRACT

Disclosed is a reception apparatus that has solved a problem that fluctuations cannot be followed immediately after a commencement of turbo equalization in a high-speed fading environment. A reception apparatus includes a soft interference canceller, an MMSE equalizer, a likelihood calculator, a de-interleaver, an SISO decoder, an information bit hard decision unit, a subtracter, an interleaver, a soft estimation value calculator, a zero storage unit, a known signal memory unit, a transmission path estimator, and a plurality of switches. At the time of equalization, the transmission path estimator uses, as a reference signal, a known signal stored in the known signal memory unit or an output of the MMSE equalizer. Meanwhile, at the time of a first equalization, the soft interference canceller is given a '0' value from the zero storage unit as a reference signal.

3 Claims, 3 Drawing Sheets

(51) Int. Cl.
*H03M 13/37* (2006.01)
*H03M 13/29* (2006.01)
*H03M 13/25* (2006.01)
*H04L 1/00* (2006.01)

(52) U.S. Cl.
CPC ... *H03M 13/2957* (2013.01); *H03M 13/3746* (2013.01); *H03M 13/6331* (2013.01); *H04L 1/0045* (2013.01); *H04L 1/0058* (2013.01)

(58) Field of Classification Search
CPC ......... H03M 13/6325; H03M 13/2963; H03M 13/29; H03M 13/258; G06F 11/1068; G06F 3/0619; G06F 3/064; G06F 3/0688; G11C 11/409; G11C 29/52; H04L 25/03318; H04L 1/0045; H04L 1/0058
USPC ........ 714/776, 780, 701, 757, 758; 375/224, 375/227, 240.27, 259, 262, 261, 265, 241
See application file for complete search history.

(56) References Cited

U.S. PATENT DOCUMENTS

| | | | |
|---|---|---|---|
| 2009/0254797 A1* | 10/2009 | Wu | H03M 13/3746 714/794 |
| 2009/0307567 A1* | 12/2009 | Tsunehara | H03M 13/3723 714/794 |
| 2011/0004803 A1 | 1/2011 | Yokomakura et al. | |
| 2013/0265964 A1* | 10/2013 | Yokomakura | H04W 72/0406 370/329 |
| 2014/0086299 A1 | 3/2014 | Pustovalov et al. | |

OTHER PUBLICATIONS

Tadashi Matsumoto et al., Turbo Equalization: Fundamentals and Information Theoretic Considerations, 2007, vol. J90-B No. 1 pp. 1-16.
International Search Report dated Mar. 31, 2015.

* cited by examiner

RECEPTION APPARATUS PERFORMING TURBO EQUALIZATIONS

CROSS-REFERENCE TO RELATED APPLICATIONS

This application is a Continuation Application of PCT International Application No. PCT/JP2015/056499 filed on Mar. 5, 2015, which designated the United States. This application claims priority to Japanese Patent Application No. 2014-071044 filed on Mar. 31, 2014, the entire contents of which are incorporated herein by reference.

FIELD OF THE INVENTION

The present invention relates to a reception apparatus performing turbo equalization, and more particularly to a signal processing in single-carrier communications.

BACKGROUND OF THE INVENTION

In a multipath propagation environment such as mobile communications, intersymbol interference occurs due to delay waves. In order to reduce the influence of the intersymbol interference, in recent years, implementation of turbo equalization technology has been studied.

FIG. 1 is a functional block diagram showing an example of turbo equalization in a conventional single-carrier communications receiver.

In the turbo equalization, a replica signal corresponding to an interference signal is generated from a reference signal 123 and a transmission path characteristic (estimation result) estimated by a transmission path estimator 101. The interference is removed from a received signal 121 by cancelling the replica signal. A minimum mean square error (MMSE) equalizer 103 performs MMSE equalization processing on the interference-removed signal. A likelihood calculator 104 calculates a bit likelihood from the equalization output, and a de-interleaver 105 performs de-interleaving on the bit likelihood. A soft-in soft-out (SISO) decoder 106 performs error correction on the de-interleaved result. A soft estimation value calculator 110 calculates a soft estimation value from the bit likelihood interleaved by an interleaver 109, and feeds back the soft estimation value as the reference signal 123.

Further, in a frame section of a known signal, the known signal stored in a known signal memory unit 113 is used as the reference signal 123, and thus a data symbol is also used in demodulation processing as the reference signal. By repeating the above described process, the interference signal can be eliminated.

In general, since a soft estimation value cannot be obtained in the first loop of the turbo equalization, the soft estimation value becomes '0' stored in a zero storage unit 111. Accordingly, an interference replica is not generated, so that an interference cancellation is not performed.

Further, the transmission path estimator 101 does not update its transmission path characteristic in sections other than the known signal section and holds the transmission path characteristic until a next update.

Patent Document 1: Japanese Patent Application Publication No. 2002-190744

Non-patent Document 1: Tadashi MATSUMOTO et al. (1), "Turbo Equalization: Fundamentals and Information Theoretic Considerations," <online>, January 2007, The Institute of Electronics, Information and Communication Engineers, <Searched on Jan. 31, 2014>, Internet <URL http://www.ieice.org/cs/jpn/JB/PDF/2007/j90-b_1_1.pdf>

However, in a fast fading environment, the conventional technology described above cannot follow such fading because the transmission path estimation is updated only in a known signal section in the first loop of turbo equalization. Therefore, the performance of the bit likelihood and the equalizer output in the first loop under the fast fading environment is deteriorated, and the number of loops of turbo equalization increases in order to obtain the desired performance, which is problematic. As a result, an initial delay until information bits can be obtained increases, and the initial delay is maintained as it is even in subsequent processing.

SUMMARY OF THE INVENTION

In accordance with an embodiment of the present invention, there is provided a reception apparatus, which receives a single carrier signal and performs turbo equalization, the reception apparatus including: a soft interference canceller, an MMSE equalizer, a likelihood calculator, a de-interleaver, an SISO decoder, an information bit hard decision unit, a subtracter, an interleaver, a soft estimation value calculator, a zero storage unit, a known signal memory unit, a transmission path estimator, and a plurality of switches. In the iterations of the turbo equalization, the transmission path estimator uses a known signal stored in the known signal memory unit or an output of the MMSE equalizer as a reference signal for transmission path estimation.

Further, the reception apparatus described above may further include a hard decision unit. In the first iteration of the turbo equalization, the hard decision unit performs a hard decision on the output of the MMSE equalizer, and the transmission path estimator uses the decision result as a reference signal for transmission path estimation.

EFFECT OF THE INVENTION

In accordance with the present invention, it is possible to improve the equalization performance by enhancing the tracking performance in the transmission path estimation in the first iteration of the turbo equalization. Thus, it is possible to reduce the implementation scale and processing delay by reducing the number of loops for obtaining desire performance of the turbo equalization.

DETAILED DESCRIPTION OF THE EMBODIMENTS

Hereinafter, embodiments of the present invention will be described with reference to the accompanying drawings which form a part hereof.

Figure 1:
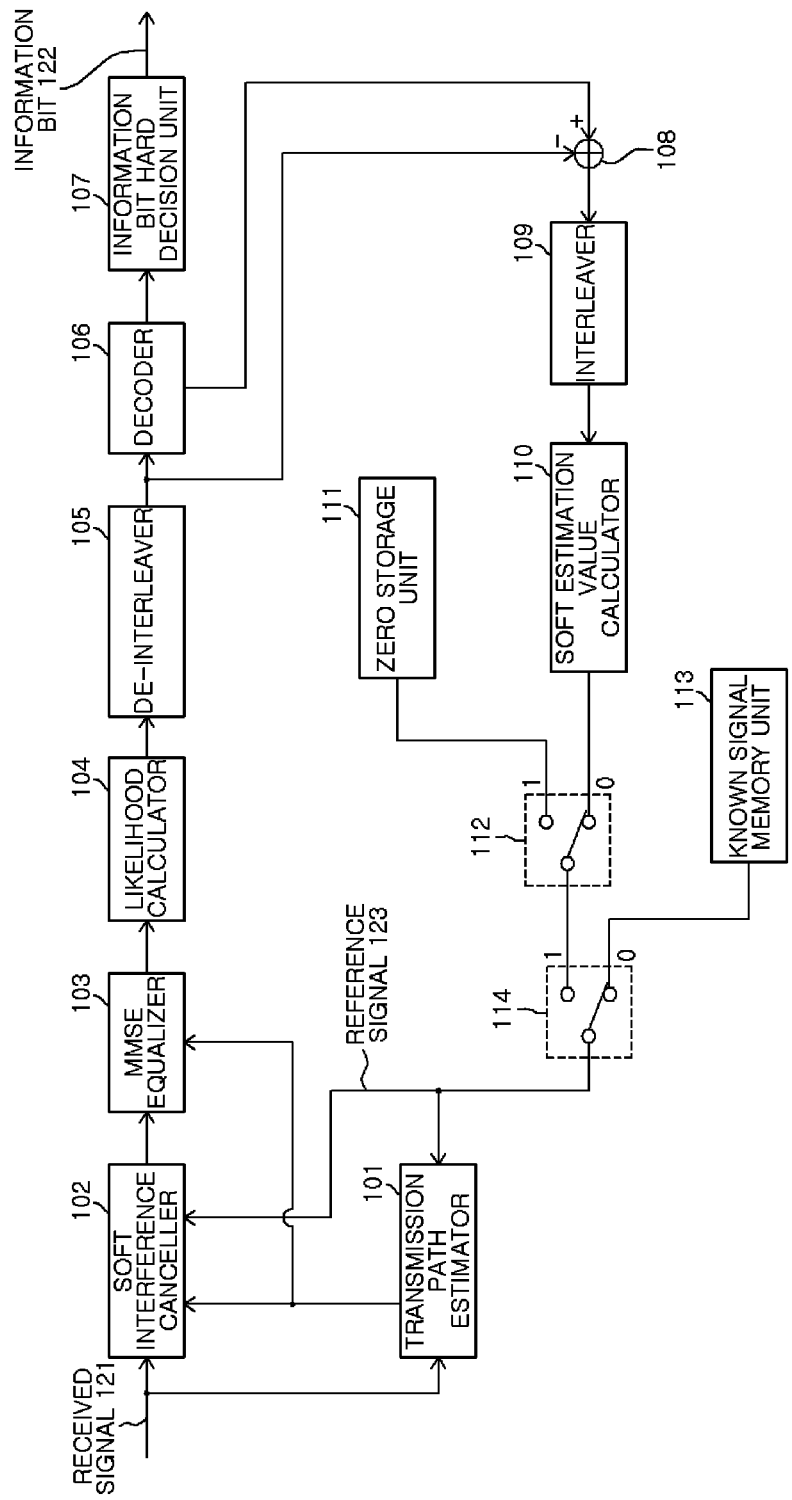
FIG. 1 is a functional block diagram showing an example of turbo equalization in a single-carrier communication receiver.
Figure 2:
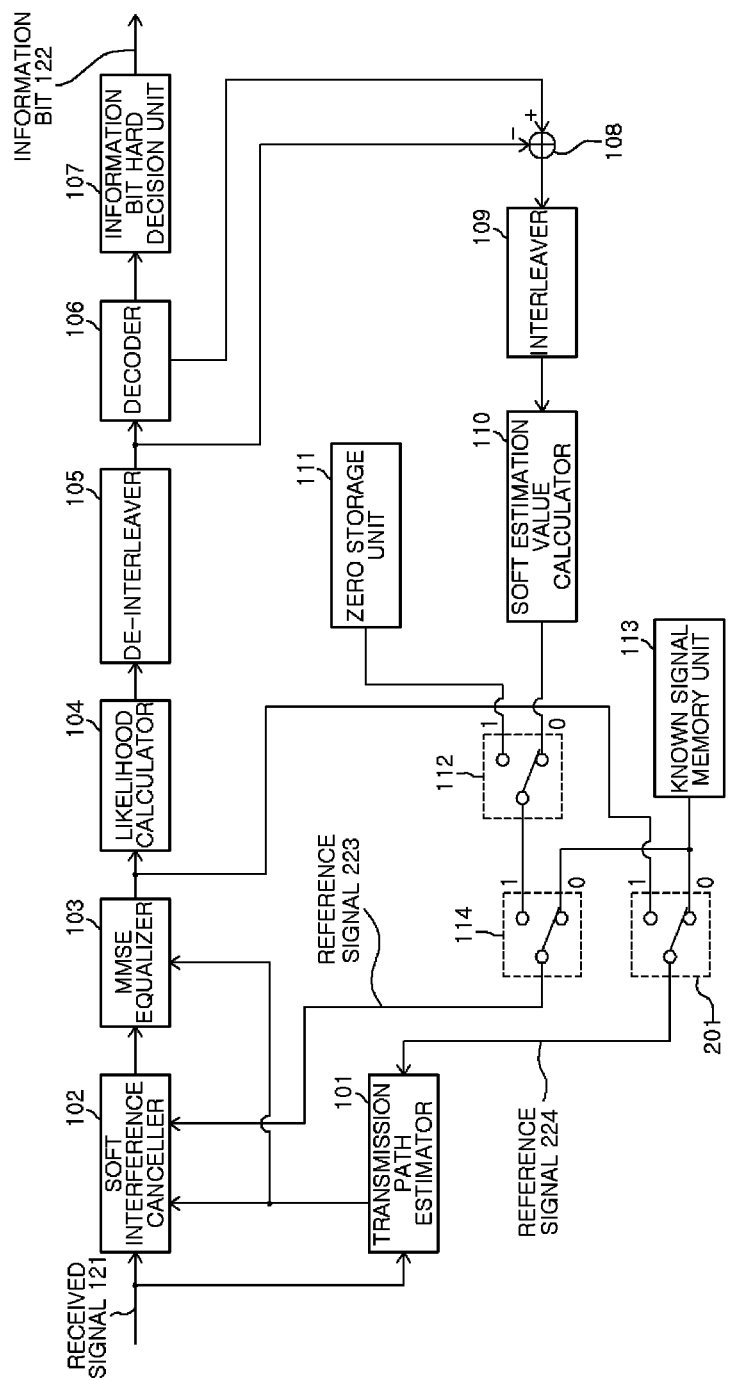
FIG. 2 is a functional block diagram showing a single-carrier communication receiver according to a first embodiment of the present invention.

FIG. 2 is a functional block diagram showing a single-carrier communications receiver according to a first embodiment of the present invention.

The first embodiment includes a transmission path estimator 101, a soft interference canceller 102, a minimum mean square error (MMSE) equalizer 103, a likelihood calculator 104, a de-interleaver 105, a soft-in soft-out (SISO) decoder 106, an information bit hard decision unit 107, a subtracter 108, an interleaver 109, a soft estimation value calculator 110, a zero storage unit 111, a reference signal switch 112, a known signal memory unit 113, a reference signal switch 114, and a reference signal switch 201. In the present embodiment, different reference signals 224 and 223 are respectively assigned to the transmission path estimator 101 and the soft interference canceller 102.

The transmission path estimator 101 estimates a propagation status between transmission and reception by using a received signal 121 and the reference signal 224 for use in the transmission path estimation, and outputs a transmission path characteristic to the soft interference canceller 102 and the MMSE equalizer 103.

In the transmission path estimation, for example, when r(n) is the received signal, s(n) is the reference signal, ĥ(n,l) refers to the transmission path characteristic (see, e.g., Eq. 2), and L is a transmission path estimation length, an error signal e(n) is represented by Eq. 1:

$$e(n) = r(n) - \sum_{l=0}^{L-1} \hat{h}(n, l) \cdot s(n - l) \qquad \text{Eq. 1}$$

$$\hat{h}(n, l) = \hat{h}(n - 1, l) + \mu \cdot e(n) \cdot s^*(n - l) \qquad \text{Eq. 2}$$

where n is basically an index of a symbol, but a sampling of a sub-symbol may be used. Further, μ is a step size parameter. The reference signal s(n), which is used in the transmission path estimator 101 of the present embodiment, is a known signal or an output signal of the MMSE equalizer 103.

The soft interference canceller 102 generates a replica signal corresponding to an interference signal using the transmission path characteristic and an input reference signal 223, and outputs an interference-removed signal obtained by cancelling the replica signal from the input received signal 121 to the MMSE equalizer 103.

In the interference cancellation, for example, when H^(n) refers to a transmission path estimation matrix, s(n) is a reference signal vector, and r(n) is a received signal vector, an interference-removed signal vector r'(n) is represented by Eq. 3:

$$r'(n) = r(n) - H^{\hat{}}(n) \cdot s(n) \qquad \text{Eq. 3,}$$

where the transmission path estimation matrix H^(n) is represented by Eq. 4:

$$\hat{H}(n) = \begin{bmatrix} \hat{h}(n, 0) & \ldots & \hat{h}(n, L-1) & & 0 \\ & \ddots & & \ddots & \vdots \\ 0 & & \hat{h}(n, 0) & \ldots & \hat{h}(n, L-1) \end{bmatrix} \qquad \text{Eq. 4}$$

The reference signal s(n), which is used in the soft interference canceller 102 of the present embodiment, is one of '0', 'a known signal', and 'a soft symbol from the soft estimation value calculator 110'.

The MMSE equalizer 103 performs equalization processing based on the MMSE criterion by using the interference-removed signal and the transmission path characteristic inputted thereto, and outputs an equalized signal to the likelihood calculator 104 and the reference signal switch 201. When $w^H(n)$ is the MMSE filter coefficient and r'(n) is the interference-removed signal vector, the equalized signal X^(n) is represented by, for example, Eq. 5:

$$\hat{X}(n) = w^H(n) \cdot r'(n) \qquad \text{Eq. 5}$$

where $w^H(n)$ is represented by Eq. 6.

$$w^H(n) = (\hat{H}(n) \cdot \hat{H}^H(n) + \sigma_n^2 I_L)^{-1} \cdot \hat{H}(n) \qquad \text{Eq. 6}$$

where $\sigma_n^2$ is a noise power and $I_L$ is a unit matrix of L×L. The MMSE equalizer 103 may actually remove residuals which cannot be removed by the soft interference canceller 102. In the equalized signal X^(n), the phase and amplitude of the output signal of the soft interference canceller 102 are corrected, and the power of the signal which has been distributed to a plurality of samples is integrated into one sample.

The likelihood calculator 104 calculates a log-likelihood of each modulated bit from the output signal of the equalizer, and outputs the bit log-likelihood to the de-interleaver 105. The bit log-likelihood is calculated, for example, by calculating a distance from each ideal mapping point $c_k$ of the modulation scheme and obtaining a minimum distance min $(d_o(c_k))$ to the ideal point which becomes 0 and a minimum distance $\min(d_1(c_k))$ to the ideal point which becomes 1 for each modulation bit. The bit log-likelihood $L^E_e(c_k)$ is represented by Eq. 7:

$$L_e^E(c_k) = \min(d_1(c_k)) - \min(d_o(c_k)) \qquad \text{Eq. 7.}$$

The de-interleaver 105 sorts a sequence of the bit log-likelihoods, which has been sorted in a predetermined order at a transmission side, into an original order, and outputs the de-interleaved result to the SISO decoder 106 and the subtracter 108.

The SISO decoder 106 performs error correction decoding on the de-interleaved bit log-likelihoods and outputs the error-corrected information bit log-likelihoods to the information bit hard decision unit 107. The SISO decoder 106 also outputs the error-corrected encoded bit log-likelihoods to the subtracter 108. The information bits are original binary information turbo-encoded at the transmission side.

The error correction decoding is soft-input soft-output decoding using a Soft Output Viterbi Algorithm (SOVA) algorithm or a Bahl-Cocke-Jelinek-Raviv (BCJR) algorithm, for example, for a convolutional encoded signal.

The information bit hard decision unit 107 performs a hard decision process on the error-corrected information bit log-likelihoods, and outputs the hard decision result 0 or 1 as an information bit 122.

The subtracter 108 calculates differences (bit log-likelihoods of extrinsic information) between the error-corrected encoded bit log-likelihoods (bit log-likelihoods of posteriori information) and the de-interleaved bit log-likelihoods (bit log-likelihoods of priori information), and outputs the bit log-likelihood of the extrinsic information to the interleaver 109. The bit log-likelihoods of extrinsic information are likelihoods improved by error correction processing.

When $L^D_a(c_k)$ is the bit log-likelihood of the priori information and $L^D(c_k)$ is the bit log-likelihood of the posteriori information, the bit log-likelihood of the extrinsic information $L^D_e(c_k)$ is represented by Eq. 8:

$$L_e^D(c_k) = L^D(c_k) - L_a^D(c_k) \qquad \text{Eq. 8.}$$

The interleaver 109 sorts the sequence of the bit log-likelihoods of the extrinsic information in the same predetermined order as that of the transmitting side, and outputs the interleaved result to the soft estimation value calculator 110.

The soft estimation value calculator 110 calculates bit probabilities from the interleaved bit log-likelihood of the extrinsic information, and generates a soft estimation value (soft symbol) using the bit probabilities and the ideal mapping points.

When $L'^D_e(c_k)$ refers to the bit log-likelihood of the extrinsic information, the bit probability $p(c_k,0)$ in the case of '0' and the bit probability $p(c_k,1)$ in the case of '1' are represented by Eq. 9 and Eq. 10:

$$p(c_k, 0) = \frac{1}{1 + \exp(-L'^D_e)} \quad \text{Eq. 9}$$

$$p(c_k, 1) = \frac{1}{1 + \exp(L'^D_e)}. \quad \text{Eq. 10}$$

Further, when P(n,i) (see, e.g., Eq. 12) is the symbol probability and s(i) is the ideal symbol point, the soft estimation value $\tilde{s}(n)$ is represented, for example, by Eq. 11:

$$\tilde{s}(n) = \sum_{s \in S} s(i) \cdot P(n, i) \quad \text{Eq. 11}$$

$$P(n, i) = \prod_{q=1}^{Q} p((n-1) \cdot Q + q, i[q]) \quad \text{Eq. 12}$$

where Q is the number of modulated bits, and i[q] is the q-th bit of the variable i and is 0 or 1.

The zero storage unit 111 outputs '0' to the reference signal switch 112.

The reference signal switch 112 selects the soft estimation value or '0', and outputs the selected value to the reference signal switch 114. The reference signal switch 112 selects '0' in the first iteration of the turbo equalization (i.e., when a valid soft symbol is not outputted from the soft estimation value calculator 110), and selects the soft estimation value in the second and subsequent iterations.

The known signal memory unit 113 outputs a known signal (e.g., a preamble signal or a pilot signal) between transmission and reception to the reference signal switch 114.

The reference signal switch 114 selects one of the known signal and the signal selected by the reference signal switch 112, and outputs the selected signal to the soft interference canceller 102. When the received signal 121 is in a known signal section, the known signal is selected and outputted to the soft interference canceller 102, and the signal selected by the reference signal switch 112 is outputted in sections other than the known signal section. Whether the received signal 121 is in the known signal section may be determined by well-known frame synchronization technology based on correlation with the known signal.

The reference signal switch 201 operates in conjunction with the reference signal switch 114. The reference signal switch 201 selects the known signal in the known signal section and selects the output signal of the MMSE equalizer 103 in sections other than the known signal section. Then, the selected signal is outputted to the transmission path estimator 101.

Hereinafter, an operation of the first embodiment will be described. The reference signal switch 201 continuously selects the output signal of the equalizer 103 until a known signal section appears after starting the single-carrier communications receiver. The transmission path estimator 101, the soft interference canceller 102 and the MMSE equalizer 103 operate from the beginning of the first symbol (n=0). However, since a soft symbol of '0' is assigned to the soft interference canceller 102, actual cancellation shown in Eq. 3 is not achieved.

Meanwhile, in the transmission path estimator 101 to which the output signal of the equalizer 103 is assigned as the reference signal 224, an adaptive update algorithm may be operated. That is, the transmission path estimator 101 is capable of performing transmission path estimation that can cancel or attenuate paths other than a main path as interference without using the error correction, and the transmission path estimation may reach a primary convergence state. However, if $\hat{h}(0,l)=0$ (l=1 . . . L) is assigned as an initial value of the transmission path estimation, the estimation value does not change and is almost constant.

Thereafter, when several continuous bits are ensured after de-interleaving and the decoder operates with respect to several continuous bits, the result is interleaved so that a soft symbol is intermittently outputted (spilt up) as the reference signal 223. Alternatively, when the known signal section appears, the stored known signal can be used as the reference signal 223. When this non-zero reference signal is inputted to the soft interference canceller 102 and cancellation of Eq. 3 is performed, the transmission path characteristic of the transmission path estimator 101 changes gently, thereby eventually reaching a secondary convergence state. Even when the reference signal 224 is inputted sporadically, this reference signal changes the error signal e(n) of Eq. 1, resulting in an update to at least one of the coefficients in the transmission path estimation. Since the updated coefficients are applied to subsequent interference cancellation and equalization, it approaches a final convergence state whenever the reference signal 224 is inputted.

In particular, when a preamble section in which the known signal is continuous is passed once, the transmission path characteristic becomes relatively reliable, so that the output of the equalizer 103 close to the convergence state also can be obtained. Thus, the transmission path estimation can be updated continuously by using the output of the equalizer after the preamble section.

According to the above-described first embodiment, by feeding back the output of the equalizer 103 to the transmission path estimator 101 in sections other than the known signal section in the first iteration of turbo equalization, the transmission path estimation can be updated continuously in sections other than the known signal section unlike a conventional case where the update is stopped in sections other than the known signal section. Thus, it is possible to follow the fast fading.

Figure 3:
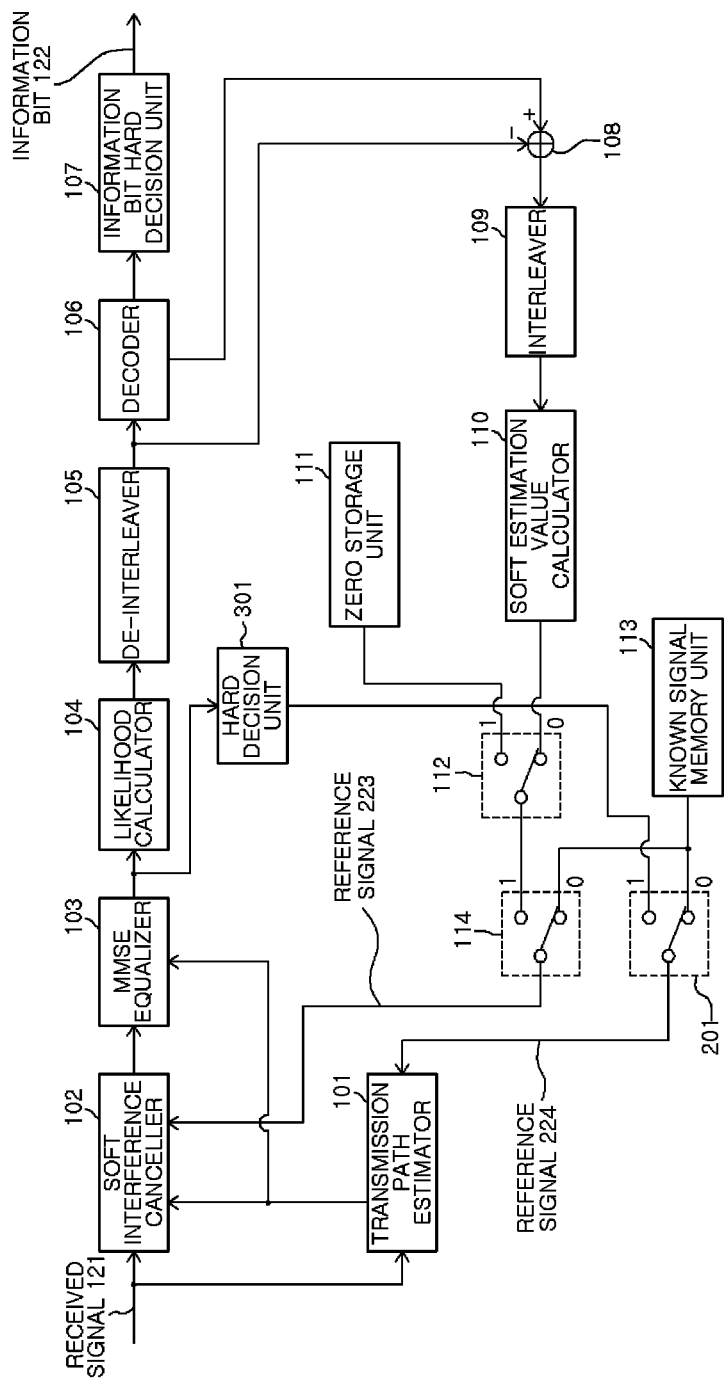
FIG. 3 is a functional block diagram showing a single-carrier communication receiver according to a second embodiment of the present invention.

FIG. 3 illustrates a second embodiment of the present invention.

FIG. 3 is a functional block diagram showing a single-carrier communications receiver which is a second embodiment of the present invention.

The second embodiment includes the transmission path estimator 101, the soft interference canceller 102, the MMSE equalizer 103, the likelihood calculator 104, the de-interleaver 105, the SISO decoder 106, the information bit hard decision unit 107, the subtracter 108, the interleaver 109, the soft estimation value calculator 110, the zero storage unit 111, the reference signal switch 112, the known signal memory unit 113, the reference signal switch 114, the reference signal switch 201 and a hard decision unit 301. The present embodiment is different from the first embodiment in that the hard decision output of the equalizer 103 is assigned as the reference signal 224 to the transmission path estimator 101.

In the second embodiment, the transmission path estimator 101, the soft interference canceller 102, the MMSE equalizer 103, the likelihood calculator 104, the de-interleaver 105, the SISO decoder 106, the information bit hard decision unit 107, the subtracter 108, the interleaver 109, the soft estimation value calculator 110, the zero storage unit 111, the reference signal switch 112, the known signal memory unit 113, the reference signal switch 114 and the reference signal switch 201 are the same as those of the first embodiment. Therefore, descriptions thereof will be omitted.

The hard decision unit 301 performs a hard decision to replace the equalized output signal to the closest ideal mapping point of the modulation scheme from the reception point, and outputs the hard decision result to the reference signal switch 201. Since the transmission path estimator 101, which receives the hard decision result as the reference signal 224, can always perform the similar operation to the training in the known signal section, it is possible to improve the transmission path estimation accuracy.

The hard decision has to be correct in a sufficient proportion (at least 50% or more), and should be applied after performing a reliable transmission path estimation. It may be configured such that the hard decision output of the equalizer 103 in the known signal section is compared with the known signal held in the known signal memory unit 113, and the hard decision is employed when they are equal to each other.

In the embodiments described above, the MMSE equalization to be processed in a time domain has been described. However, if the received signal to be inputted to the transmission path estimator 101 or the like is converted in advance into a frequency domain signal, frequency domain equalization (FDE) may be applied.

INDUSTRIAL APPLICABILITY

The present invention is suitable for radio communications using a single carrier having a relatively narrow bandwidth of a VHF or UHF band, but can be widely applied to a communications apparatus for receiving and processing turbo codes by utilizing equalization and iterative decoding.

What is claimed is:

1. A reception apparatus which receives a digitally modulated single-carrier transmission signal from a transmitter and performs turbo equalization, the reception apparatus comprising:
a transmission path estimator configured to perform a transmission path estimation between transmission and reception by using a received signal and a first reference signal;
an interference canceller configured to remove an interference signal from the received signal by using a second reference signal and an output of the transmission path estimator;
an equalizer configured to correct a phase and an amplitude of an output signal of the interference canceller;
a bit log-likelihood calculator configured to calculate bit log-likelihoods of an output signal of the equalizer;
a de-interleaver configured to restore a sequence of the bit log-likelihoods outputted from the bit log-likelihood calculator, which is arranged in a predetermined order at a transmission side, into an ordinary sequence;
an SISO decoder configured to perform soft-input soft-output error correction decoding on the bit log-likelihoods of which the sequence is restored by the de-interleaver;
an interleaver configured to rearrange the sequence of the bit log-likelihoods, which has undergone error correction in the SISO decoder, in the predetermined order;
a soft estimation value calculator configured to calculate soft estimation values by converting the bit log-likelihoods outputted from the interleaver into bit probabilities;
a first reference signal switch configured to select zero in the first iteration of the turbo equalization where the soft estimation value is not obtained, and select the soft estimation value in the second and subsequent iterations of the turbo equalization where the soft estimation value is obtained, so that the selected value is assigned as the second reference signal to the interference canceller;
a second reference signal switch configured to assign a known signal being held, instead of the soft estimation value, in a known signal section; and
a third reference signal switch configured to select the known signal in the known signal section or select the output signal of the equalizer in signal sections other than the known signal section, so that the selected signal is assigned as the first reference signal to the transmission path estimator.

2. The reception apparatus of claim 1, wherein an equalized signal hard decision unit is provided between an output of the equalizer and the third reference signal switch.

3. The reception apparatus of claim 1, wherein the interference canceller generates a replica signal corresponding to an intersymbol interference signal and removes the replica signal from the received signal, and
wherein the bit log-likelihood calculator calculates a distance between an ideal point in mapping of the digital modulation and the output signal of the equalizer, and calculates the bit log-likelihoods based on a minimum distance to an ideal point which becomes 0 and a minimum distance to an ideal point which becomes 1 for each modulation bit.

* * * * *